United States Patent [19]

Yajima et al.

[11] Patent Number: 4,911,648

[45] Date of Patent: Mar. 27, 1990

[54] IC CONNECTION/DISCONNECTION MECHANISM AND METHOD FOR CARRYING OUT THE SAME

[75] Inventors: Atsushi Yajima; Osamu Mitsui, both of Tokyo, Japan

[73] Assignee: Ando Electric Co., Ltd., Tokyo, Japan

[21] Appl. No.: 340,000

[22] Filed: Apr. 18, 1989

[51] Int. Cl.$^4$ .......................................... H01R 13/62
[52] U.S. Cl. .................................................... 439/159
[58] Field of Search ................................ 439/152–160

[56] References Cited

U.S. PATENT DOCUMENTS

| 4,582,379 | 4/1986 | Fasano | 439/159 |
| 4,668,036 | 5/1987 | Ota et al. | 439/159 |

FOREIGN PATENT DOCUMENTS 64-34190  3/1989  Japan .

Primary Examiner—Joseph H. McGlynn
Attorney, Agent, or Firm—Flynn, Thiel, Boutell & Tanis

[57] ABSTRACT

An IC connection/disconnection mechanism and a method for carrying out the same comprises a lifting plate for mounting and lifting the IC having a lead frame thereon, a measuring socket mounted on a base and having terminals capable of contacting the terminals of the IC, stoppers mounted on the base, first springs coiled around stoppers for supporting the lifting plate, a pusher having recesses at both sides thereof in which presser pins are housed corresponding to the stoppers, and second springs coiled around the presser pins and having resilience force greater than that of the first springs. Due to difference of the resilience forces of the first and the second springs, firstly the pusher is moved away from the lifting plate, then the lifting plate makes the IC move away from the measuring socket.

3 Claims, 3 Drawing Sheets

IC CONNECTION/DISCONNECTION MECHANISM AND METHOD FOR CARRYING OUT THE SAME

BACKGROUND OF THE INVENTION

1. Field of the Invention

The present invention relates to an IC (integrated circuit) connection/disconnection mechanism and a method for carrying out the same, especially to a mechanism for connecting and disconnecting a flat type IC having the lead frame therearound to and from a measuring device or socket.

2. Prior Art

A prior art connection/disconnection mechanism and a method for carrying out the same will be described.

The typical flat type IC in a manufacturing process as shown in FIG. 5 has an IC 1, a plurality of terminals 1B integrated with the IC 1 at a periphery thereof, and a lead frame integrated with the IC 1, having guide holes 1A, positioned in the manner to surround the IC 1 but severed from the IC 1 after completion of a test thereof. The test of the IC 1 is carried out for measruing a normal function or operation of the IC with use of the measuring socket (not shown) in the manner that firstly, the IC 1 having the lead frame 1C is usually positioned over the measuring socket having guide pins (not shown) corresponding to the guide holes 1A of the lead frame, secondly, the guide pins of the measruing socket are inserted into the guide holes 1A of the IC 1 so that the IC 1 is set on the measuring socket. After completion of the test, the guide holes 1A of the lead frame 1C of the IC 1 is moved away and extracted from the guide pins of the measuring socket whereby the IC 1 is removed from the socket.

There is proposed an absorbing mechanism disclosed in Japanese Utility Model Application No. 62-129377 for detachably mounting the IC 1 on the measuring socket. However, the absorbing mechanism has a problem that the lead frame is not extracted from the guide pins due to deformation of the lead frame or guide holes.

SUMMARY OF THE INVENTION

It is in object of the prsent invention to provide an IC connection/disconnection mechansim and a method for carrying out the same for preventing a lead frame of the IC from being extracted from a measuring socket at the time of disconnection operation thereof so that the IC can be connected to and disconnected from the measuring socket with ease for assuring the test of the IC in a stable condition.

To achieve the above object, an IC connection/disconnection mechanism of the present invention comprises a lifting plate for mounting and lifting an IC having terminals and a lead frame therearound, a measuring socket mounted on a base and having terminals capable of contacting terminals of the IC, stoppers mounted on the base for supporting the lifting plate and determining a range of vertically movable distance of the lifting plate, first springs coiled around the stoppers between the lifting plate and the base for supporting the lifting plate, a pusher having recesses at both sides thereof in which presser pins are housed corresponding to the stoppers, and second springs coiled around the presser pins and having resilience force greater than that of the first springs, whereby firstly the pusher is moved away from the lifting plate, then the lifting plate makes the IC move away from the measuring socket.

The above and other objects, features and advantages of the present invention will become more apparent from the following description taken in conjunction with the accompanying drawings.

PREFERRED EMBODIMENT OF THE INVENTION

Figure 1:
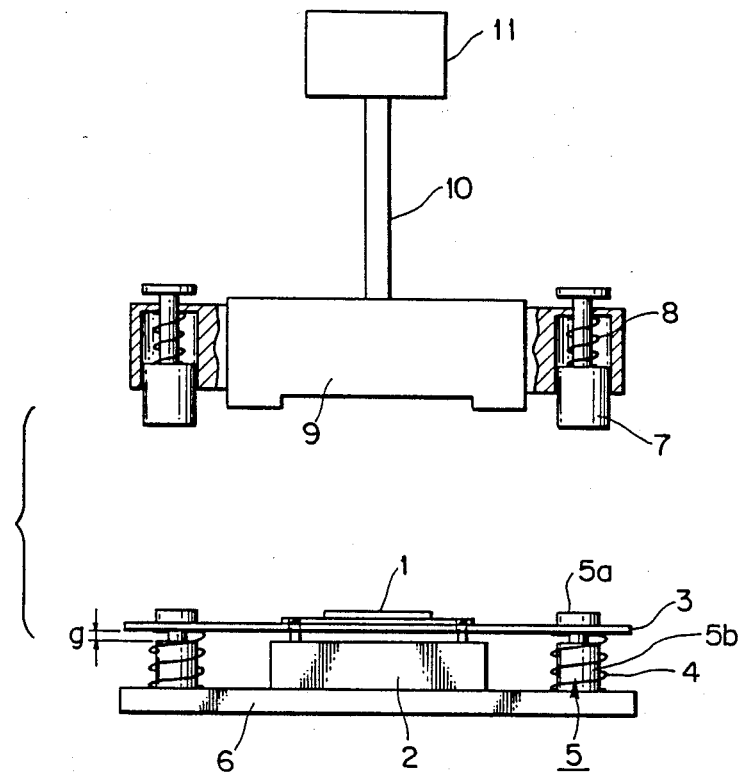
FIG. 1 is an arrangement of an IC connection/disconnection mechanism.

A preferred embodiment of the present invention will be described with reference to FIGS. 1 to 4.

The IC connection/disconnection mechanism comprises an 1C 1 having a plurality of terminals 1B provided at peripheral surface thereof and a lead frame 1C detachably integrated therewith and having a plurality of guide holes 1A, a measuring socket 2 attached to a base 6 which is positioned under the IC 1 and having a plurality of measuring terminds 2B corresponding to a plurality of terminals 1B for contacting a plurality of terminals 1B of the IC 1 and guide pins 2A corresponding to the guide holes 1A of the lead frame 1C for inserting into the guide holes 1A, a lifting plate 3 having an opening 3A corresponding to the socket 2 at the central portion thereof for receiving, supporting and lifting the IC 1, stoppers 5 mounted on the base 6 for supporting the lifting plate 3 and composed of upper portions 5a attached to the lifting plate 3 at the four corners thereof and lower portions 5b located under the lifting plate 3 and having gaps g for determining a range of vertical movement of the lifting plate 3 between the lower portions 5b and the lifting plate 3, first springs 4 coiled around the lower portions 5b and the upper portion 5a between the lifting plate 3 and the base 6, a pusher 9 positioned over the lifting plate 3 having recesses at both sides thereof in which presser pins 7 are housed to be positioned on the stoppers 5, second springs 8 coiled around the presser pins 7 in the recesses, and a drive mechanism 10 such as an air cylinder for driving the pusher 9 vertically.

The IC connection/disconnection mechanism further includes a pressure reducing valve 11 for regulating the pressure to be supplied to the drive mechanism 10 depending on a type of the ICs so that the vertical movement of the pusher 9 is regulated.

Resilience force of the second springs 8 is set to be greater than that of the first springs 4.

A method for carrying out the IC connection/disconnection mechanism will be described.

An operation for contacting or connecting the IC 1 with the socket 2 will be first described.

Figure 2:
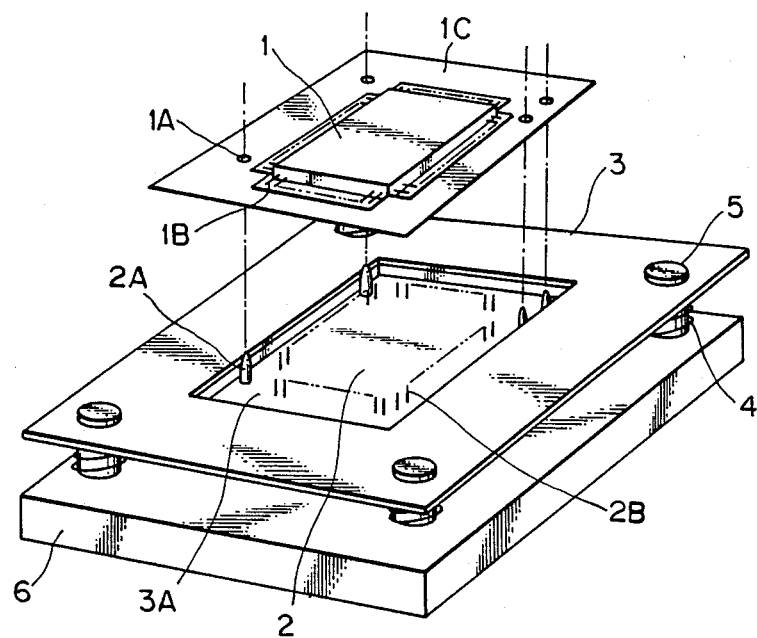
FIG. 2 is a perspective view of assistance in explaining relationship of an IC, a measuring socket attached to a base, and a lifting plate which are respectively constituents of the IC connection/disconnection mechanism.

The guide pins 2A of the socket are inserted into the guide holes 1A of the IC 1, then the 1C 1 is placed on the lifting plate 3 (FIG. 2).

Figure 3:
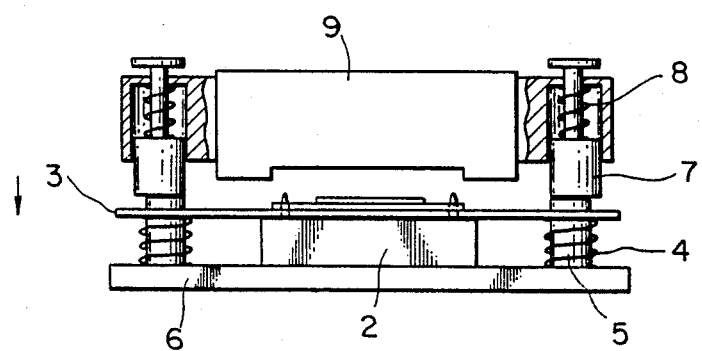
FIG. 3 is a view of assistance in explaining a movement of a pusher which is a constituent of the IC connection/disconnection mechanism.

At the state in the arrangement of FIG. 1, the pusher 9 is lowered by the forward actuation of the drive mechanism 10 whereby firstly, the presser pins 7 contact the upper stoppers 5a of the stoppers 5, secondly, the first springs 4 are constricted with lowering motion of the upper stoppes 5, thirdly, the lifting plate 3 brings into contact with the lower stoppers 5b and stops in a state where the gap g is reduced to zero as shown in FIG. 3. The second springs 8 is not constricted in the state of FIG. 3.

Figure 4:
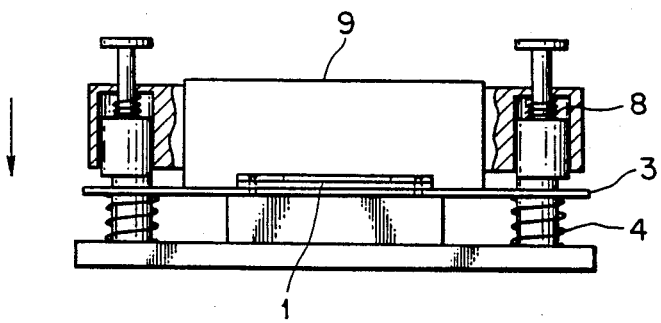
FIG. 4 is a view of assistance in explaining a state where the pusher contacts the IC.
Figure 5:
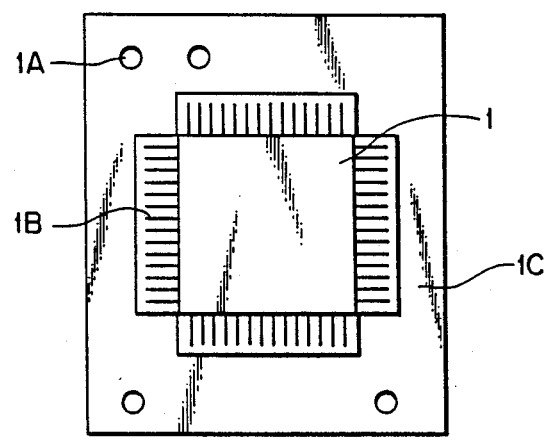
FIG. 5 is a plan view of a flat type 1C having a lead frame therearound.

At the state of FIG. 4, further lowering motion of the pusher 9 make the second springs 8 constricted so that the pusher 9 is lowered in proportion to the amount of constriction of the second springs 8 and contact the IC 1 for thereby permitting the terminals 1B of the IC 1 to contact the measuring terminals 2B of the socket 2.

An operation for disconnecting the IC 1 from the socket 2 will be then described.

At the state of FIG. 4, the pusher 9 is rised by the reverse actuation of the drive mechanism 10 whereby the second springs 8 are released from the constriction thereof and the pusher 9 is moved away from the lifting plate 3 as shown in FIG. 3. Further rising of the pusher 9 makes the second springs 4 release from the constriction thereof for thereby rising the lifting plate 3 with the resilience forth thereof whereby the guide pins 2A are moved away or disconnected from the guide holes 1A of the IC 1.

In summary, the IC connection/disconnection mechanism is carried out in the steps of firstly inserting the guide pins 2A of the socket 2 into the guide holes 1A of the IC 1 to thereby place the IC 1 on a lifting plate 3, secondly, lowering the pusher 9 by forward actuation of the drive mechanism 10 for allowing the presser pins 7 of the pusher 9 to contact the lifting plate 3 so that the first springs 4 are constricted, thirdly, further lowering the pusher 9 by further forward actuation of the drive mechanism 10 to constrict the second spring 8 so that the terminals 1B of the IC 1 contact and connect to the measuring terminals 2B of the socket 2, fourthly, rising the pusher 9 by reverse actuation of the drive mechanism 10 for allowing the second springs 8 to release from the constriction thereof so that the pusher 9 is moved away from the IC 1, and fifthly further rising the pusher 9 by further reverse actuation of the drive mechanism 10 for allowing the first spring 4 to release from the constriction thereof to thereby rise the lifting plate 3, whereby the guide pin 2A is moved away from the guide hole 1A.

That is, due to the difference of the resilience forces of the first and second springs 4, 8, firstly the pusher 9 is moved away from the lifting plate 3, then the lifting plate 3 makes the IC 1 move away from the socket 2.

With the arrangement of the IC connection/disconnection mechanism of the present invention, inasmuch as the second springs held in the pusher have resilience force greater than that of the first springs for supporting the lifting plate so that the IC is lifted by the lifting plate, it is not necessary to adjust the hight of the pusher and the presser pins relative to the IC whereby IC can be connected to and disconnected from the socket which assures the precise measurment of the IC in a stable condition.

Furthermore, inasmuch as the vertical movement of the pusher is regulated by the pressure reducing valve, the contact pressure of the pusher with respert to the 1C can be regulated according to the type of the ICs.

Although the invention has been described in its preferred form with a certain degree of particularity, it is to be understood that many variations and changes are possible in the invention without departing from the scope thereof.

What is claimed is:

1. An IC connection/disconnection mechanism comprising:
    an IC having a plurality of terminals provided at peripheral surface thereof and a lead frame detachably integrated therewith and having guide holes;
    a measuring socket attached to a base, positioned under the IC and having a plurality of measuring terminals corresponding to the plurality of terminals for contacting the plurality of terminals of the IC, and guide pins corresponding to the guide holes of the lead frame for inserting into the guide holes of the IC;
    a lifting plate having an opening corresponding to the socket at the central portion thereof for receiving, supporting and lifting the IC;
    stoppers mounted on the base for supporting the lifitng plate and composed of upper portions attached to the lifting plate at the four corners thereof and lower portions located under the lifting plate and having gaps between the lower portions and the lifting plate for determining a range of vertical movement of the lifting plate;
    first springs coiled around the lower portions between the lifting plate and the base;
    a pusher positioned over the lifting plate having recesses at both sides thereof in which presser pins are housed to be positioned on the stoppers;
    second springs coiled around the presser pins in the recesses, resilient force of the second springs being greater than that of the first springs; and
    a drive mechanism for driving the pusher vertically.

2. An IC connection/disconnection mechanism in accordance with claim 1, further including a pressure reducing valve for regulating the pressure to be supplied to the drive mechanism depending on a type of the ICs so that the vertical movement of the pusher is regulated.

3. A method for carrying out an IC connection/disconnection mechanism comprises the steps of:
    (1) inserting guide pins of a socket into guide holes of an IC to thereby place the IC on a lifting plate;
    (2) lowering a pusher by forward actuation of a drive mechanism for allowing presser pins of the pusher to constrict the lifting plate so that first springs are constricted;
    (3) further lowering the pusher by further forward actuation of the drive mechanism to constrict second springs so that terminals of the IC contact and connect to measuring terminals of the socket;
    (4) rising the pusher by reverse actuation of the drive mechanism for allowing the second springs to release from the constriction thereof so that the pusher is moved away from the IC; and
    (5) further rising the pusher by further reverse actuation of the drive mechanism for allowing the first spring to release from the constriction thereof to thereby rise the lifting plate, whereby the guide pins are moved away from the guide holes.

* * * * *

UNITED STATES PATENT AND TRADEMARK OFFICE
CERTIFICATE OF CORRECTION

PATENT NO. : 4 911 648

DATED : March 27, 1990

INVENTOR(S) : Atsushi YAJIMA et al

It is certified that error appears in the above-identified patent and that said Letters Patent is hereby corrected as shown below:

Column 4, line 11; after "at" insert ---a---.

Column 4, line 58; change "rising" to ---raising---.

Column 4, line 62; change "rising" to ---raising---.

Column 4, line 65; change "rise" to ---raise---.

Signed and Sealed this

Twenty-seventh Day of August, 1991

Attest:

HARRY F. MANBECK, JR.

*Attesting Officer*     *Commissioner of Patents and Trademarks*